(12) United States Patent
Steiner et al.

(10) Patent No.: US 10,690,320 B2
(45) Date of Patent: *Jun. 23, 2020

(54) TRANSFORMING GRAPHICAL EXPRESSIONS TO INDICATE BUTTON FUNCTION

(71) Applicant: TOSHIBA GLOBAL COMMERCE SOLUTIONS HOLDINGS CORPORATION, Tokyo (JP)

(72) Inventors: David John Steiner, Raleigh, NC (US); John David Landers, Jr., Raleigh, NC (US); Dean Frederick Herring, Youngsville, NC (US); Brad Matthew Johnson, Raleigh, NC (US)

(73) Assignee: Toshiba Global Commerce Solutions, Tokyo (JP)

( * ) Notice: Subject to any disclaimer, the term of this patent is extended or adjusted under 35 U.S.C. 154(b) by 569 days.

This patent is subject to a terminal disclaimer.

(21) Appl. No.: 15/452,234

(22) Filed: Mar. 7, 2017

(65) Prior Publication Data

US 2017/0175981 A1 Jun. 22, 2017

Related U.S. Application Data

(63) Continuation of application No. 14/186,020, filed on Feb. 21, 2014, now Pat. No. 9,677,740.

(51) Int. Cl.
*G09F 13/04* (2006.01)
*F21V 9/40* (2018.01)
(Continued)

(52) U.S. Cl.
CPC .............. *F21V 9/40* (2018.02); *F21V 23/003* (2013.01); *F21V 33/0052* (2013.01);
(Continued)

(58) Field of Classification Search
CPC .............................. G06F 21/577; G03F 1/0053
See application file for complete search history.

(56) References Cited

U.S. PATENT DOCUMENTS 7,255,622 B2  8/2007  Stevenson et al.
7,507,929 B2  3/2009  Streifler
(Continued)

FOREIGN PATENT DOCUMENTS

CN           2802867 Y       8/2006

OTHER PUBLICATIONS

430BOOST-SENSE1—Capacitive Touch BoosterPack for the LaunchPad: User's Guide, May 2013, Texas Instruments Incorporated, Dallas, United States.
(Continued)

*Primary Examiner* — Rayeez R Chowdhury
(74) *Attorney, Agent, or Firm* — Patterson + Sheridan, LLP (57) ABSTRACT

To provide a user with descriptive images for each function performed by a button, the embodiments described herein use a transforming graphical expression that presents different images depending on the particular function the button is currently performing. For example, if the button is used to increase speaker volume, the graphical expression may display plus sign, but if the button is currently being used to navigate through a display menu, the graphical expression may be transformed into an arrow to indicate the direction a selection element in the menu moves if the button is activated. Thus, as the current function of the button changes, the graphical expression presented to the user also changes. In this manner, the same button may be used to perform multiple functions while presenting to a user a customized graphical expression indicating the current function of the button.

20 Claims, 8 Drawing Sheets

(51) Int. Cl.
*F21V 33/00* (2006.01)
*H01H 13/83* (2006.01)
*F21V 23/00* (2015.01)
*H03K 17/96* (2006.01)
*F21Y 113/10* (2016.01)

(52) U.S. Cl.
CPC ........... *H01H 13/83* (2013.01); *H03K 17/962* (2013.01); *H03K 17/964* (2013.01); *F21Y 2113/10* (2016.08); *H01H 2219/002* (2013.01); *H01H 2219/03* (2013.01); *H01H 2219/039* (2013.01); *H01H 2219/054* (2013.01); *Y10T 29/49105* (2015.01)

(56) References Cited

U.S. PATENT DOCUMENTS

| | | | |
|---|---|---|---|
| 7,550,236 | B2 | 6/2009 | Barber et al. |
| 7,671,289 | B2 | 3/2010 | Matsukawa et al. |
| 8,168,905 | B2 | 5/2012 | Yang |
| 8,182,104 | B2 | 5/2012 | Reinker |
| 8,258,987 | B2 | 9/2012 | Anorozo |
| 8,408,723 | B2 | 4/2013 | Porter et al. |
| 8,421,755 | B2 | 4/2013 | Seelhammer et al. |
| 8,487,751 | B2 | 7/2013 | Laitinen et al. |
| 2004/0223206 | A1 | 11/2004 | Peterman |
| 2007/0205088 | A1* | 9/2007 | Lee ........................ H01H 13/83 200/314 |
| 2009/0002198 | A1* | 1/2009 | Bach ........................ H01Q 1/44 341/20 |
| 2009/0103010 | A1* | 4/2009 | Okamoto .......... G02F 1/133305 349/73 |
| 2009/0179862 | A1 | 7/2009 | Strong, IV |
| 2009/0231283 | A1 | 9/2009 | Polak et al. |
| 2009/0244706 | A1* | 10/2009 | Levola ................. G02B 5/1885 359/569 |
| 2010/0039832 | A1 | 2/2010 | Ahlgren et al. |
| 2010/0097346 | A1 | 4/2010 | Sleeman |
| 2010/0118560 | A1 | 5/2010 | Hayama et al. |
| 2010/0259497 | A1 | 10/2010 | Livingston et al. |
| 2010/0290252 | A1* | 11/2010 | Teng .................... G02B 6/0018 362/625 |
| 2011/0140935 | A1* | 6/2011 | Anorozo ............. H03K 17/962 341/33 |
| 2011/0147181 | A1* | 6/2011 | Catlin ..................... G09F 13/04 200/311 |
| 2011/0205161 | A1 | 8/2011 | Myers et al. |
| 2011/0267285 | A1 | 11/2011 | Cheng et al. |
| 2012/0200475 | A1 | 8/2012 | Baker et al. |
| 2012/0206369 | A1 | 8/2012 | Chou et al. |
| 2012/0206392 | A1 | 8/2012 | Ng et al. |
| 2012/0279843 | A1 | 11/2012 | Wippler |
| 2013/0082952 | A1* | 4/2013 | Kobayashi ....... H04N 21/42208 345/173 |

OTHER PUBLICATIONS

Chan, Vincent et al., MSP430 Capacitive Single-Touch Sensor Design Guide: Application Report, Jan. 2008, Texas Instruments Incorporated, Dallad, United States.

R.A. Dayan, Et Al.: "Architecture for Controlling Additional Keyboard Indicators", IBM Technical Disclosure Bulletin, vol. 41, No. 1, Jan. 1998. IP.com-IPCOM000122805D.

* cited by examiner

TRANSFORMING GRAPHICAL EXPRESSIONS TO INDICATE BUTTON FUNCTION

CROSS-REFERENCE TO RELATED APPLICATIONS

This application is a continuation of co-pending U.S. patent application Ser. No. 14/186,020, filed Feb. 21, 2014, which is herein incorporated by reference in its entirety.

BACKGROUND

Some displays (e.g., monitors, televisions, touch panels, etc.) include at least one button for capturing user input. For example, the user may use the button to instruct the display to turn on or off, change a setting of the display (e.g., brightness or contrast), change a display mode of the monitor, and the like. These buttons are usually located on a bezel of the display and may be located on any side of the display (e.g., facing the user or on a bottom or side surface of the display). In some displays, the function associated with the buttons is expressed pictorially or in words (e.g., "MENU" or "POWER") on or near the buttons. Further still, some monitors back light these graphical expressions using a light source (e.g., a LED) to improve their viewability.

The graphical expressions, however, are limited to one expressed function. However, the display may use a button to perform multiple functions, for example, turn up the volume of integrated speakers as well as navigate through a displayed menu. Because there may not be a single graphical expression that covers both of the functions performed by the button, a designer must either pick only one graphical expression (perhaps the function that is used most often) or place multiple graphical expressions on or near the button where each graphical expression correlate to one of the button's functions. The former strategy may lead to user confusion while the latter may cause design clutter and increase the size of the bezel. Of course, the designer could choose to add enough buttons so that each button has only one function, but this may increase cost and the area needed to house the buttons.

SUMMARY

One embodiment described herein is an electronic device that includes a button configured to perform first and second functions that are different, the button include a pattern formed by portions of an optically transmissive substrate exposed by openings in an opaque material disposed over the transmissive substrate, and the pattern includes a first portion and a second portion that are non-overlapping on the substrate, the first portion including an optical filter material. The electronic device includes at least one visible light source configured to selectively emit light of a first color and light of a second color, where, when emitting light of the first color, the first portion is illuminated and generates, at least in part, a first visual indication of the first function, and when emitting light of the second color, the second portion is illuminated and the optical filter material blocks the light of the second color, thereby preventing the first portion from being illuminated, and when emitting light of the second color the second portion generates a second visual indication of the second function.

Another embodiment described herein is a method that includes forming a pattern in an opaque material, the pattern dividing an area on an optically transmissive substrate into at least a first portion and a second portion that are disposed in a common layer and disposing an optical filter material on the optically transmissive substrate in the first portion of the pattern where the optical filter material blocks visible light of a first predetermined wavelength from passing there thru. The method includes forming a button configured to perform first and second functions that are different, the button includes at least one light source arranged to emit light at the first predetermined wavelength and a second predetermined wavelength into the transmissive substrate, where, when emitting the first predetermined wavelength, the second portion is illuminated and generates a first visual indication of the first function, and wherein, when emitting the second predetermined wavelength, the first portion is illuminated and generates, at least in part, a second visual indication of the second function.

Another embodiment described herein is a user-activated button for an electronic device. The button includes an optically transmissive substrate configured to receive, and pass there thru, light of a first wavelength and light of a second wavelength and a transforming graphical expression disposed on the transmissive substrate and includes a first portion and a second portion that are co-planar, where a first portion of the graphical expression includes an optical filtering material that blocks the light of the first wavelength but not light of the second wavelength. When a light source emits light of the first wavelength, a first image is illuminated in the graphical expression indicating a first visual indication of the button, the first image is defined by a shape of the second portion of the graphical expression and, when the light source emits light of the second wavelength, a second image is illuminated in the graphical expression indicating a second visual indication of the button, the second image is defined, at least in part, by a shape of the first portion.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

To provide a user with descriptive images for each function performed by a button, the embodiments described herein use a transforming graphical expression that presents different images depending on the particular function the button is currently performing. For example, if the button is used to increase speaker volume, the graphical expression may display plus sign, but if the button is currently being used to navigate through a display menu, the graphical expression may be transformed into an arrow to indicate the direction a selection element in the menu moves if the button is activated. Thus, as the current function of the button changes, the graphical expression presented to the user also changes. In this manner, the same button may be used to perform multiple functions while presenting to a user a customized graphical expression indicating the current function of the button.

Figure 1:
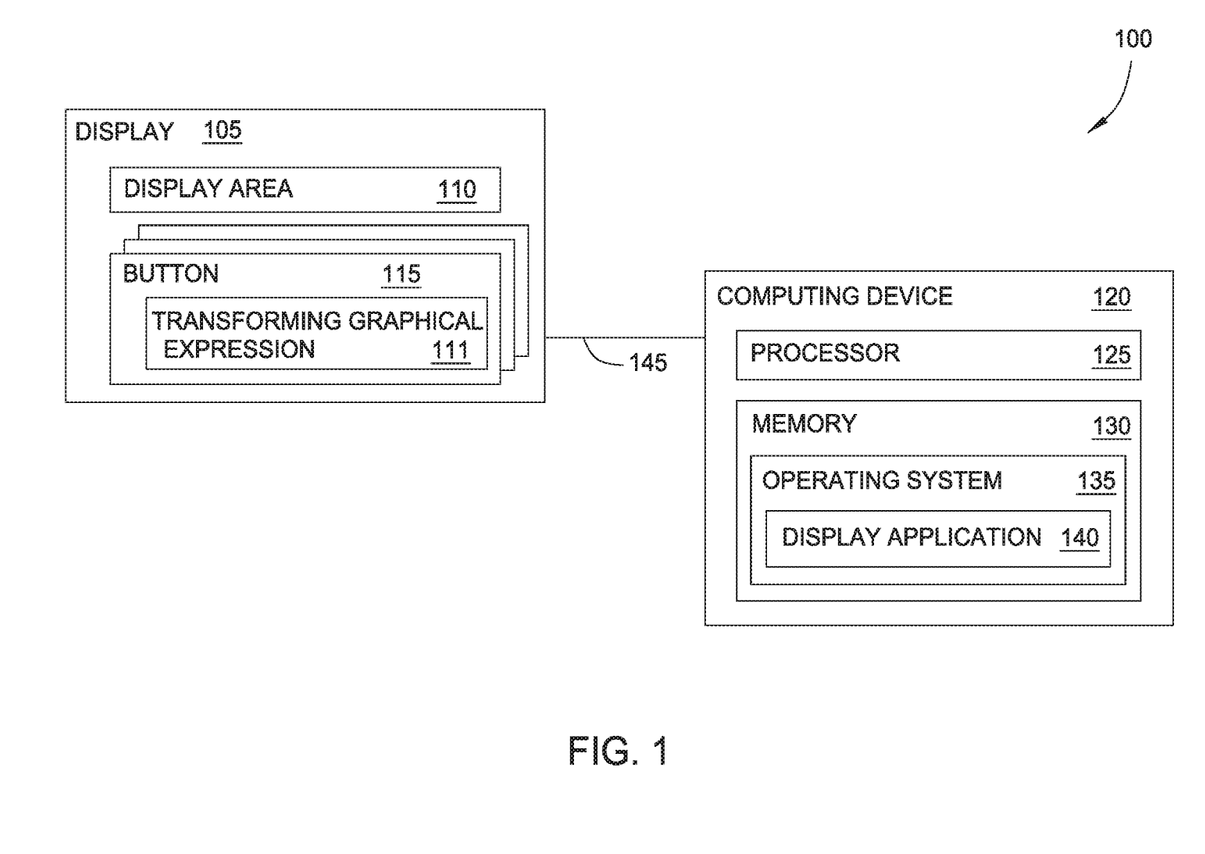
FIG. 1 illustrates a computer system with a display, according to one embodiment described herein.

FIG. 1 illustrates a computer system 100 with a display 105, according to one embodiment described herein. The display 105 includes a display area 110 where an image is presented to the user (also referred to as the viewable area of the display 105). The image may be updated as subsequent display frames are received at the display 105 from a computing device 120. The display 105 also includes one or more buttons 115 that each includes a transforming graphical expression 111 that indicates the current function of the button 115. As the function of the button 115 changes, the graphical expression 111 also changes (or transforms) to an image that informs the user of the button's current function. As such, the transforming graphical expression 111 includes a plurality of different images where each image may represent a different function of the button 115. The user may either interact with the graphical expression 111 directly to activate the button 115 (i.e., the user touches or presses the graphical expression 111) or the user activates the button 115 by touching a portion of the button 115 that does not include the graphical expression 111 (e.g., the graphical expression is located above a switching mechanism that the user presses to activate the button's function). The details of the button 115 and the transforming graphical expression 111 will be discussed in greater detail below.

The computing device 120 includes a processor 125 and memory 130. The processor 125 represents any number of processor where each processor may include one or more processing cores. Furthermore, the processor 125 may either be a general purpose processor (e.g., a CPU) or an application-specific processor.

Memory 130 may include volatile or non-volatile forms of memory elements (e.g., SRAM, DRAM, hard disk, Flash, and the like). As shown, memory 130 includes an operating system 135 which may be any operating system capable of performing the functions described herein. Memory 130 also includes a display application 140 executing within the operating system 135. The display application 140 may use the communication link 145 to control the display 105. In one embodiment the computing device 120 and display 105 may be integrated into a unitary body (e.g., a tablet or laptop computer). In this example, the communication link 145 may be a data bus for transforming data between the display application 140 and display 105. Alternatively, where the computing device 120 and display 105 are not integrated, the communication link 145 may be, e.g., a USB cable, Ethernet cable, HDMI cable, and the like.

The display application 140 may transmit display frames to update the image presented on the display area 110. In addition, the display application 140 may receive user input via the buttons 115 which may be used to configure the display area 110. For example, the buttons 115 may permit the user to change the brightness or contrast of the images displayed in area 110, change the input port used to receive display frames (e.g., switch from DVD player to television signal), add closed captioning, power the display 105 on and off, and the like.

In one embodiment, instead of the display application 140 being on the computing device 120, the application 140 may be on the display 105. In this case, the application 140 may be a hardware module and/or firmware that displays configuration settings on the area 110 and receives user input via the buttons 115. Based on the user's selection, the display application 140 then updates the settings of the display 105. As such, this process could be done without the display 105 communicating with the computing device 120—i.e., the user selections need not be sent to the computing device 120.

Figure 2:
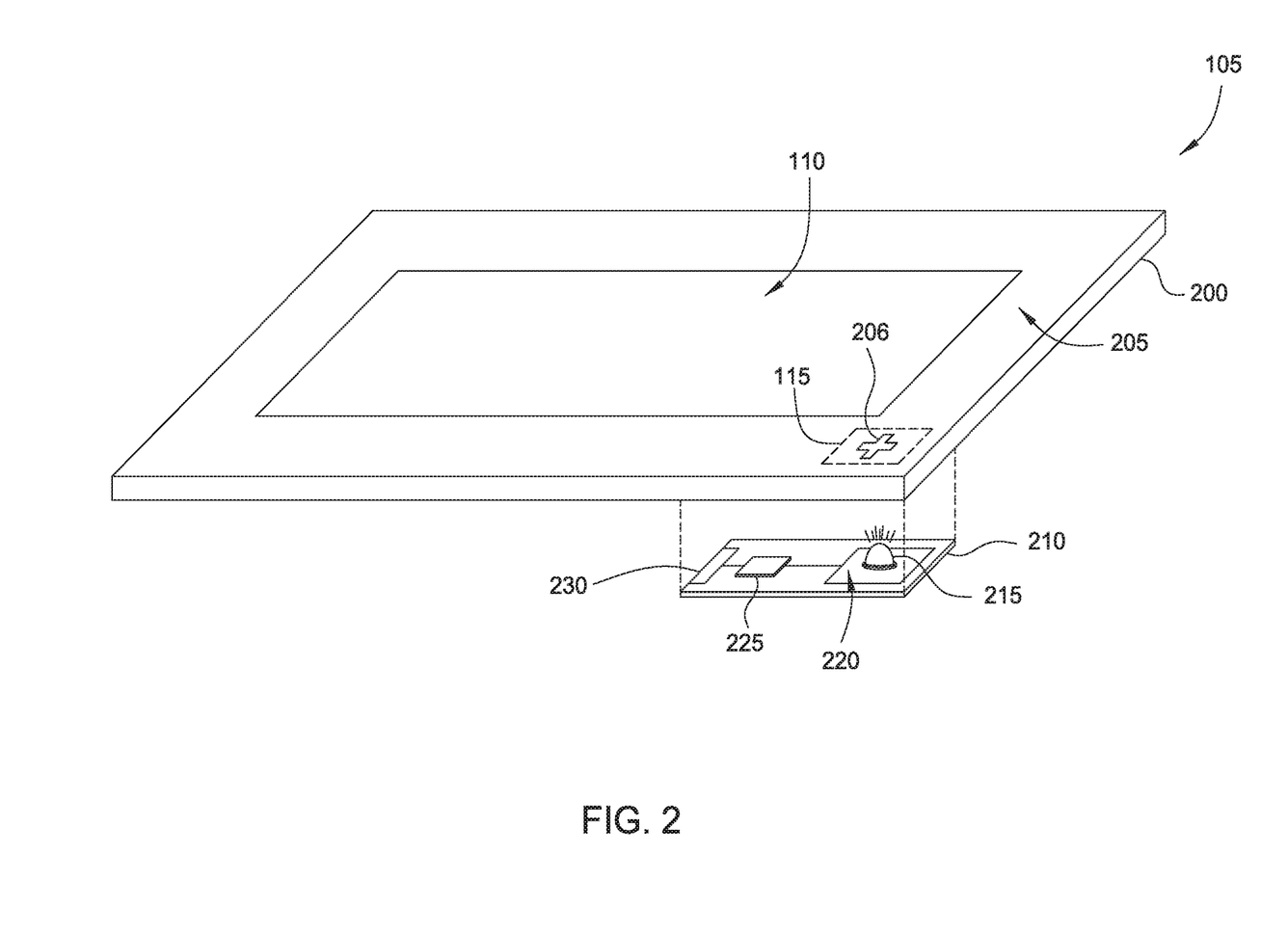
FIG. 2 illustrates a display with a backlit button, according to one embodiment described herein.

FIG. 2 illustrates the display 105 with a backlit button 115, according to one embodiment described herein. Specifically, FIG. 2 provides an exploded view of the display 105 that includes an optically transmissive substrate 200 and a printed circuit board (PCB) 210. Other possible components of the display 105, such as a frame, stand, display screen system (e.g., LCD, LED, OLED, Plasma, projection, etc), and the like are omitted.

The transmissive substrate 200 may be any material suitable for a display that permits light to pass through at least a portion of the substrate 200 substantially uninhibited such as glass, plexiglass, a polymer mixture, and the like. As shown, the user-facing surface of the substrate 200 is divided into the display area 110 as discussed above and a bezel 205. Although FIG. 2 shows the bezel 205 as being a region on the substrate 200, in other embodiments, the bezel 205 may be defined by a frame that is used to support the transmissive substrate 200. In either case, the bezel 205 includes the button 115 which includes a transforming graphical expression 206 (shown here as a plus sign).

To backlight the button 115, and more specifically, the graphical expression 206, the PCB 210 includes a light source 215. In one embodiment, the light source 215 emits light of a particular color (e.g. light at a particular wavelength). Furthermore, the light source 215 may emit light with at least two different colors (e.g., a multi-colored LED that can selectively emit blue and red light). In another embodiment, the PCB 210 may include a plurality of light sources 215 where each light source emits light of a particular color—e.g., a blue LED and a red LED. As will be discussed in more detail below, controlling the color of light used to backlight the button 115 determines which image is presented by the transforming graphical expression 206.

PCB 210 includes a sensor 220 for determining when the user has activated the button 115. In the embodiments below, the sensor 220 is described as a touch sensor for determining whether an input object (e.g., a user's finger or a stylus) has contacted or is proximate to the button 115. For example, the sensor 220 may be a capacitive sensor that includes one or more electrodes that produce an electric field that is altered when the input object contacts the button 115. However, the sensor 220 is not limited to a capacitive sensor. In other embodiments, the sensor 220 may be a piezo switch or pressure transducer that is activated when the user presses on button 115, which in these examples, would be movable. In capacitive sensing, however, the button 115 may not move when touched by the user since the sensor 220 measures the effect the user's finger has on an electric field which may not depend on any physical movement of the button 115. Regardless of the type of sensor 220, to activate the button 115 the user either touches the portion of button 115 that includes the graphical expression 206 or some other region. For example, the user may need to touch the surface of the button 115 that includes the graphical expression 206 to activate the sensor. If the sensor 220 is a piezo switch or pressure transducer, the button 115 may include a separate physical actuator that is pressed in order to activate sensor 220. In this case, the graphical expression 111 may either be displayed on the physical actuator or on a surface of the button that is close to the actuator.

The PCB 210 includes an electronic component 225 (e.g. an ASIC or controller) electrically coupled to the sensor 220. The component 225 may include hardware and/or firmware for determining when the user has activated the button 115. For example, component 225 may measure the electric fields associated with sensor 220 and determine, based on predefined thresholds, when the user has contacted the button 115. The component 225 may then send a message, using data port 230, to the display application (not shown) which uses the input to configure the display 105. As described in FIG. 1, the display application may be located in the display 105 or located in a computing device coupled to the display 105.

Figure 3A:
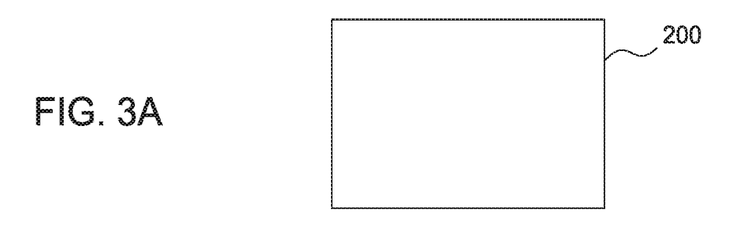
FIGS. 3A-3I illustrates a method for fabricating a transforming graphical expression, according to one embodiment described herein.
Figure 3B:
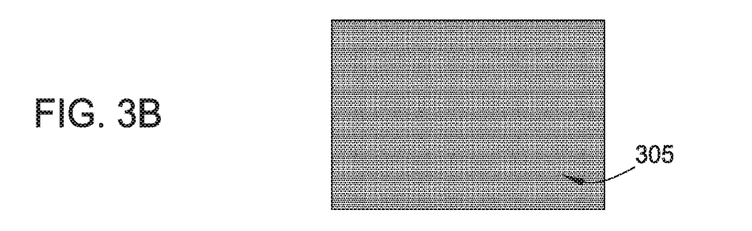

FIGS. 3A-3I illustrates a method for fabricating a transforming graphical expression, according to one embodiment described herein. Specifically, FIG. 3A illustrates a portion of the optically transmissive substrate 200. The optically transmissive substrate 200 may permit all visible light regardless of the color/wavelength to pass through. However, the embodiments herein may used with a substrate 200 that selectively blocks some range(s) of wavelengths as long as the light used to backlight the graphical expression is not within the blocked range. In FIG. 3B, an opaque material 305 is disposed over the substrate. The opaque material 305 may be any material that prevents light from passing through. In one embodiment, the opaque material 305 may prevent all electromagnetic radiation within the visible light spectrum (e.g., around 390 nm to 700 nm) from passing through. The opaque material 305 may be painted or sprayed onto the substrate as a liquid which then hardens as it dries. The opaque material 305 may also be subjected to heat after being applied onto the substrate. In another example, the opaque material 305 may be deposited onto the substrate as a thin film.

In one embodiment, the opaque material 305 is selectively disposed only on the bezel or edge of the transmissive substrate 200 of the display screen (e.g., the glass screen). As such, a center portion of the transmissive substrate 200 (not shown in FIGS. 3A-3I) may be left uncovered by the opaque material 305 for displaying an image to the user. In another embodiment, the opaque material 305 be part of a frame attached to the bezel of the display screen and supports the transmissive substrate. In this example, instead of painting or depositing the opaque material onto the transmissive substrate, the frame, which is opaque, is attached or coupled to the transmissive substrate 200.

Figure 3C:
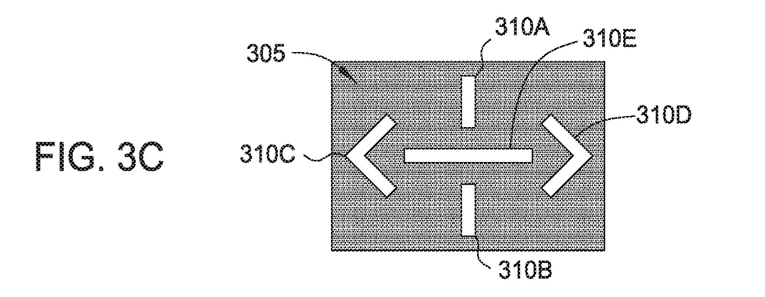

In FIG. 3C, a pattern is formed in the opaque material 305. For example, if the opaque material 305 was sprayed or deposited onto the substrate material, a portion of the material 305 is removed to reveal the transmissive substrate. For example, the opaque material 305 may be selectively etched to form the optically transmissive areas 310A-E. Thus, if a light source is placed on the side of the transmissive substrate opposite the one shown (i.e., the substrate is back lit), light will pass through the transmissive areas 310A-E but not the portion of the substrate still covered by the opaque material 305. In this manner, the transmissive areas 310A-E establish the different elements of the graphical expression associated with a button.

Figure 3D:
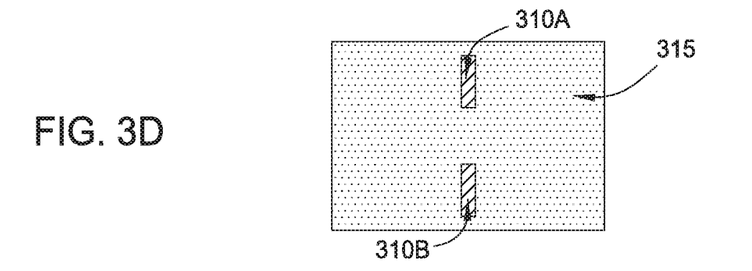

FIG. 3D illustrates placing a first mask 315 over the patterned substrate shown in FIG. 3C. That first mask 315 includes apertures that align with the optically transmissive areas 310A and 310B but covers the other portion of the substrate. A first optical filter may then be applied to the substrate which permits light of only a certain wavelength (or range of wavelengths) to pass through. For example, the first optical filter applied in FIG. 3C may permit only green light (e.g., approximately 510 nanometers) to pass through while all other visible light is substantially blocked (e.g., absorbed or reflected). Thus, if the substrate is back lit using a white light source, in areas where the green optical filter is applied, only green light passes through to the side shown in FIGS. 3A-3I—the other wavelengths in the white light are absorbed or reflected. To dispose the first optical filter onto the substrate, the material of the first optical filter may be sprayed, rolled, or deposited onto the first mask 315. In one embodiment, the optical filter is transmissive in narrow band wavelengths. For example, the optical filters described herein may be a dichroic filter or interference filter that selectively passes light of a small range of colors while reflecting other colors. Furthermore, in one embodiment, the optical filters may comprise a plurality of different optical filter materials (e.g., arranged in stacked layers) that, in combination, allows only a particular wavelength or range of wavelengths to pass.

Figure 3E:
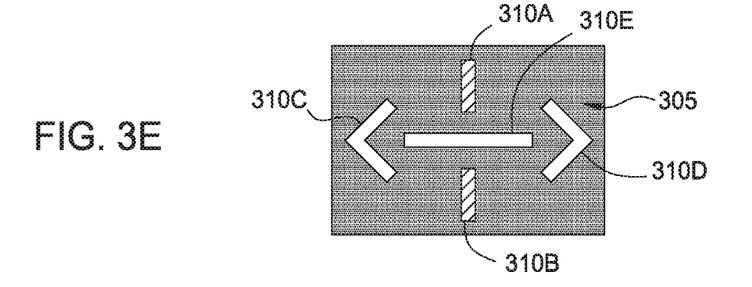

FIG. 3E illustrates the result of applying the first optical filter in FIG. 3D and removing the first mask 315. As shown, areas 310A and 310B are now covered by the first optical filter while the other areas 310C-E as well as the opaque material 305 remain uncovered by the first optical filter. As such, if the substrate is back lit with any wavelength of light other than the wavelengths that are passed by the first optical filter, no light (or substantially no light) passes through areas 310A and 310B.

Figure 3F:
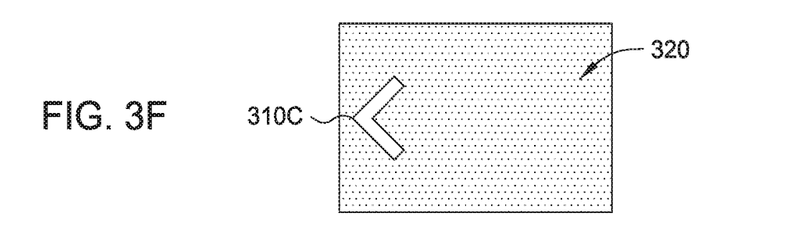

FIG. 3F illustrates placing a second mask 320 over the substrate. As shown, the second mask 320 is aligned with the area 310C so that when a second optical filter is applied, only this portion of the substrate is covered. In one embodiment, the second optical filter applied in FIG. 3F is different than the first optical filter applied in FIG. 3D. That is, the second optical filter applied in FIG. 3F selectively filters different wavelengths of light than the first optical filter applied in FIG. 3D. For example, the second optical filter may permit only red light (e.g., approximately 590 nanometers) to pass through the filter while all other visible light is blocked. Alternatively, the first and second optical filters may permit a range of wavelengths (e.g., multiple colors) to pass while preventing other wavelengths from passing through. For example, the first optical filter applied in FIG. 3D may permit only green and yellow light to pass (e.g., approximately 510 nm-570 nm) while the second optical filter applied in FIG. 3F may permit yellow, orange, and red light to pass (e.g., approximately 570 nm-650 nm). As will be discussed in more detail below, the range of wavelengths that the different optical filters permit to pass through may overlap and the graphical expression can still present different images to the user.

Figure 3G:
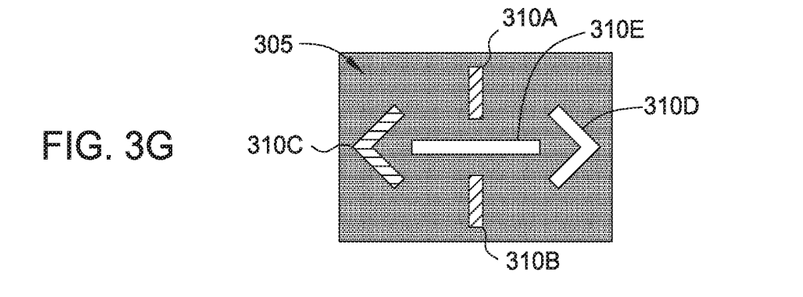

As shown in FIG. 3G, mask 320 is removed and only area 310C is covered by the second optical filter. As such, if the substrate is back lit with any wavelength of light except for the wavelengths that are passed by the second optical filter, no light (or substantially no light) passes through area 310C. Like the first optical filter, the second optical filter may be applied by spraying, rolling, or depositing the corresponding material.

Figure 3H:
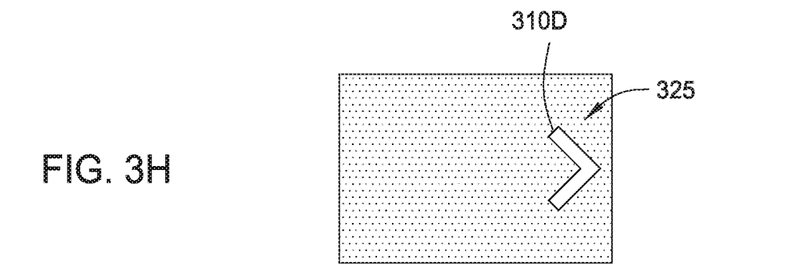

In FIG. 3H, a third mask 325 is disposed over the substrate which includes an aperture that aligns with area 310D on the substrate. Moreover, a third optical filter is disposed on the substrate which is different than the first and second optical filters. Specifically, the third optical filter permits light of a different wavelength (or a different range of wavelengths) to pass through than both the first and second optical filters.

Figure 3I:
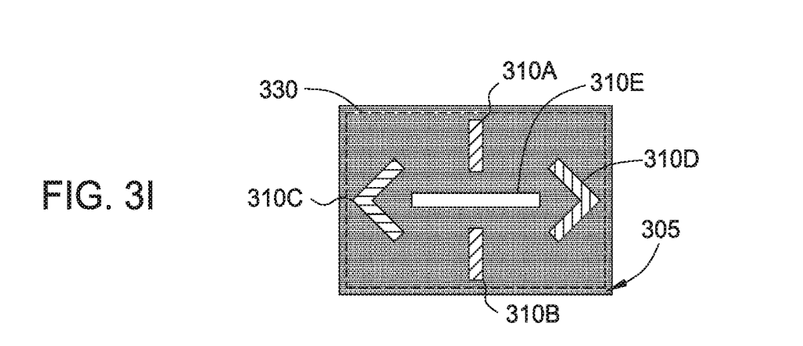

In FIG. 3I, the third mask 325 is removed and only the area 310D is covered by the third optical filter. As such, if the substrate is back lit with any wavelength of light except for the wavelengths that are passed by the third optical filter, no light (or substantially no light) passes through area 310D.

Because the optical filter disposed in areas 310A and 310B is different from the optical filters in areas 310C and 310D and the optical filter disposed in area 310C is different from the optical filter disposed in area 310D, the color of the light source used to back lit the substrate may determine which portions 310A-D are illuminated and which are not. Thus, the areas 310A-E included in a graphical expression 330 can present different illuminated images to the user by controlling the light source used to back light the substrate. Stated differently, the optical filters in the areas 310A-E substantially block different colored light, and thus, by controlling the light source, the areas 310A-E can present different images. As used herein, substantially blocking light means blocking enough light such that the desired image is distinctively, visually discernible using the light propagated through the areas 310A-E of the graphical expression that do not block the wavelength being emitted by the light source, even if some amount of light is propagated through the other transmissive portions of the graphical expression that are intended to block the wavelength being emitted by the light source.

Moreover, in FIG. 3I, no optical filter is disposed in area 310E. Thus, regardless of the color of the light source used to back-light the substrate, this light will pass through area 310E. However, in other embodiments, area 310E may also be masked and covered with a fourth optical filter which is different than the first, second, and third optical filters.

In another embodiment, an additional process step may performed where a light diffuser is disposed on the substrate such that the light passing through the substrate passes through the diffuser before reaching the user. The light diffuser may be any material that scatters the light emitted from the light source illuminating the graphical expression 330. Advantageously, the light diffuser softens the light and prevents glare.

Although FIGS. 3C-3I illustrate an embodiment where the opaque material is disposed onto the transmissive substrate, it is equally permissible to first form the graphical expression on a frame that is then mounted onto a display screen. In this process, the material of the frame may be removed as shown in FIG. 3C to form the areas 310A-E on a separate transmissive substrate. The optical filters described above may then be selectively disposed in the areas 310A-D. Once the graphical expression 330 is finished, the frame may then be mounted onto a bezel of a display screen.

Figure 4A:
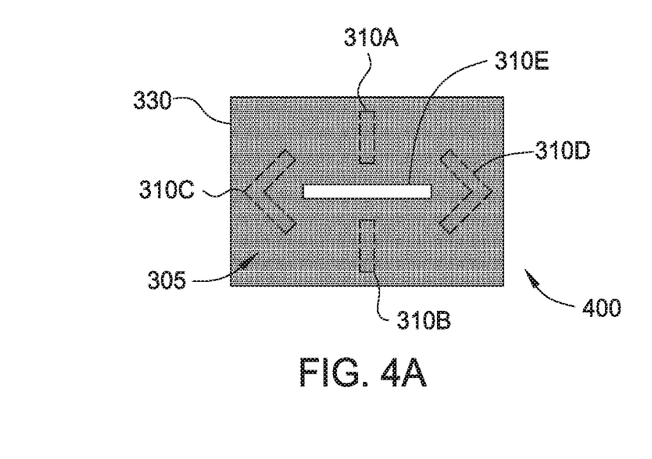
FIGS. 4A-4D illustrate different modes of a transforming graphical expression in a button, according to embodiments described herein.

FIGS. 4A-4D illustrate different modes of a button with a transforming graphical expression 330, according to embodiments described herein. In FIGS. 4A-4D, the ghosted or dashed lines indicate areas 310A-E that are not illuminated while the solid lines indicate areas 310A-E that are illuminated by one or more light sources back lighting the button. As shown in FIG. 4A, during mode 400, the middle area 310E is illuminated while the areas 310A-D are not. Moreover, it is assumed for the examples below that the opaque material 305 blocks substantially all light, regardless of wavelength, from passing through. In one example, the light emitting from the light source may be selected such that the optical filters deposited in areas 310A-D absorb or reflect substantially all of the light. Because optical filter material may never have been deposited in area 310E, this area allows the light to pass through the button to a front view (i.e., the view shown) seen by the user.

Because only area 310E is illuminated, a first image presented by the graphical expression 330 is defined by the shape of area 310E. Here, area 310E was designed to illustrate a minus sign which may be used to indicate to a user that activating the button will decrease some value (e.g., speaker volume, contrast, brightness, etc.).

Figure 4B:
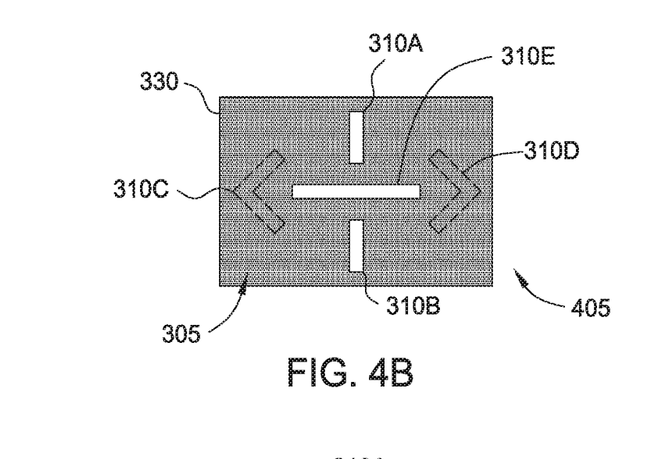

In mode 405 of FIG. 4B, areas 310A, 310B, and 310E are illuminated by the light emitted from the light source. For example, assuming the optical material deposited in areas 310A and 310B permits only green light to pass, if the light source emits green light then areas 310A, 310B, and 310E are illuminated in the color green. Because the optical materials in areas 310C and 310D absorb or reflect green light, these areas are not illuminated.

The shapes of areas 310A, 310B, and 310E combine to form a second image of the graphical expression 330. Here, these areas form a plus sign which may be used to indicate to a user that activating the button will increase a value (e.g., speaker volume, contrast, brightness, etc.)

Figure 4C:
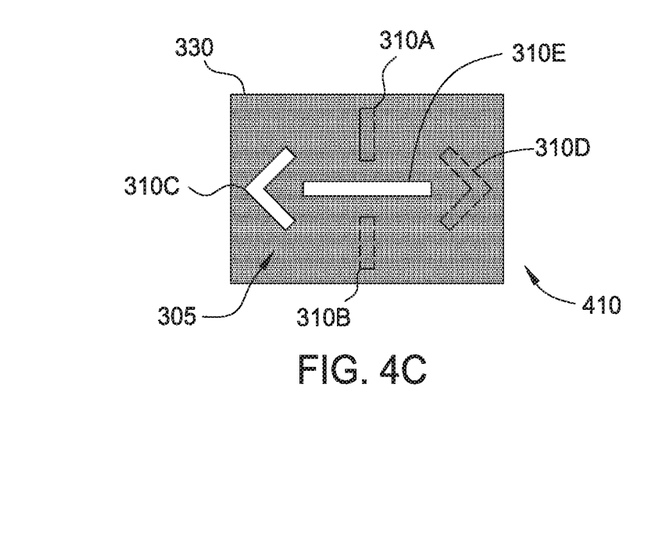

In mode 410 of FIG. 4C, areas 310C and 310E are illuminated by the light emitted from the light source. For example, assuming the optical material in area 310C permits only red light to pass, if the light source emits red light, than both areas 310C and 310E are illuminated in the color red. The optical filters disposed in areas 310A, 310B, and 310D are chosen such they absorb or reflect red light, and thus, very little light is passed through these areas.

As shown here, the shapes of areas 310C and 310E form a third image of the graphical expression 330—i.e., a left arrow. This image may be used by a display screen to indicate to a user that activating the button moves a cursor in a displayed menu in a left direction or switches between different menus or options.

Figure 4D:
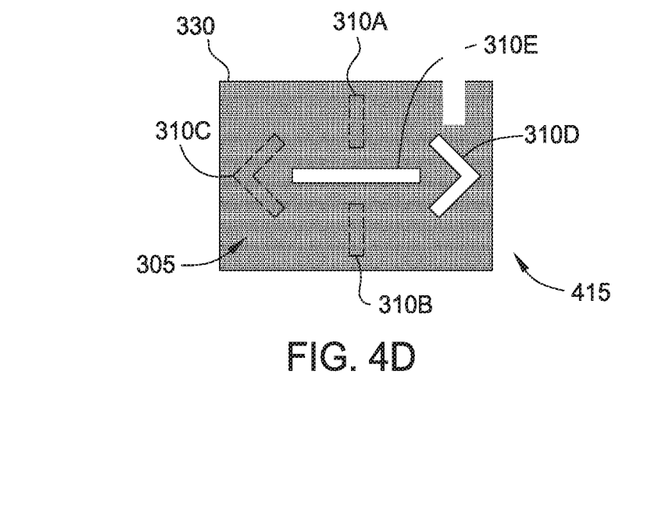

In mode 415 of FIG. 4D, areas 310D and 310E are illuminated while areas 310A-C are not. For example, the optical material in area 310D may permit violet light to pass while the optical materials in areas 310A-C do not. If the light source emits violet light, then areas 310D and 310E are illuminated this color.

As shown, the shapes of areas 310D and 310E combine to form a fourth image of the graphical expression 330—i.e., a right arrow—which may be used by the display screen to indicate to a user that activating the button moves a cursor in a displayed menu in a right direction or switches between different menus or options. Thus, as shown by the four illuminated images in FIGS. 4A-4D, the same graphical expression 330 can transform to present four different images to a user. Moreover, the four different images may indicate to the user a current function of the button—i.e., the button can have four different functions. Thus, as the function assigned to the button changes, the display application also changes the image presented by the graphical expression 330 to indicate to the user the new function. To do so, the display application changes the light used to back-light the button.

As mentioned above, the range of wavelengths that the different optical filters in areas 310A-D permit to pass through may overlap and the graphical expression can still present the four different images to the user. For example, the optical filter in areas 310A and 310B may permit green and yellow light to pass, while the optical filter in area 310C may permit yellow and red light to pass. However, if the light source only emits, e.g., green light or red light (i.e., never emits yellow light), then the fact the ranges of the wavelengths that are passed by the optical materials overlap is irrelevant. Thus, by controlling the light source, the display screen controls the image displayed. But in some embodiments, it may be helpful to use optical materials with ranges that overlap. Continuing the example above, the display screen can display a first image by emitting green light that illuminates areas 310A-B but not area 310C, a second image by emitting red light that illuminates area 310C but not areas 310A-B, and a third image by emitting yellow light that illuminates areas 310A-C. In this case, the first, second, and third images would all be different, and thus, could be designed to indicate three separate functions of the same button to the user.

Furthermore, the display screen may use either multiple different light sources that each emit only one color of light (e.g., a red, green, and violet light source) or one or more multicolored light sources that each emit multiple colors (e.g., an LED that emits red, green, and violet light). If a multicolored light source is used, the display application may control the light source such that only one color of light is emitted at any given time.

Figure 5A:
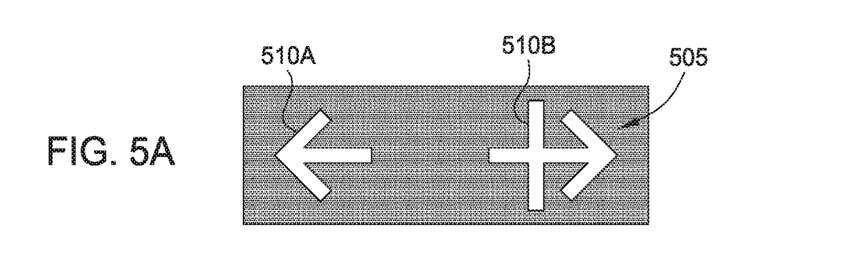
FIGS. 5A-5E illustrate a method for fabricating multiple transforming graphical expressions in parallel, according to one embodiment described herein.

FIGS. 5A-5E illustrate a method for fabricating multiple transforming graphical expressions in parallel, according to one embodiment described herein. That is, FIGS. 5A-5E illustrate fabricating respective graphical expressions for two buttons on a common substrate. As shown in FIG. 5A, an optically transmissive substrate is covered with an opaque material 505 that has been patterned such that the material 505 in areas 510A and 510B is removed to expose the transmissive substrate. In one embodiment, the opaque material 505 and transmissive substrate may be any of the materials disclosed above in FIGS. 3A-3I.

Figure 5B:
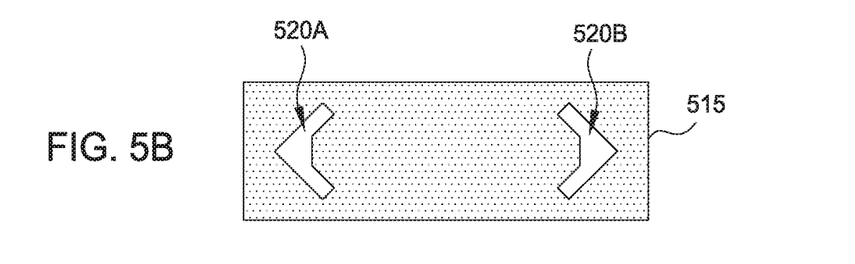

In FIG. 5B, a first mask 515 is disposed over the substrate such that apertures in the mask 515 align with portions of the areas 510A and 510B. Specifically, the boundaries of the apertures define areas 520A and 520B that are sub-regions of areas 510A and 510B in FIG. 5A. A first optical filter material is then disposed on areas 520A and 520B which permits light of only a certain wavelength (or range of wavelengths) to pass through.

Figure 5C:
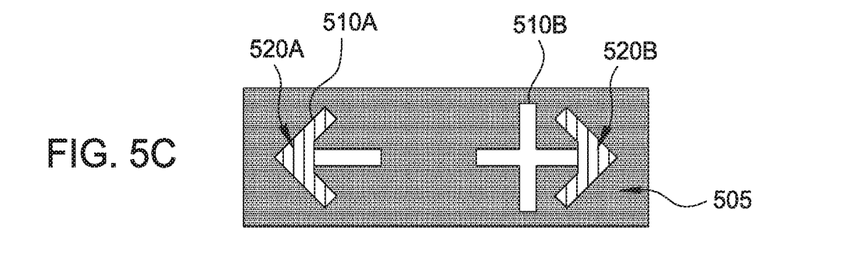

As shown in FIG. 5C, when the first mask 515 is removed, the areas 520A and 520B within areas 510A and 510B are covered by the first optical filter while the remaining portions of areas 510A and 510B remain uncovered. That is, when back lit, areas 520A and 520B permit only light with a certain wavelength or range of wavelengths from passing while the uncovered portions of 510A and 510B may permit all visible light to pass through.

Figure 5D:
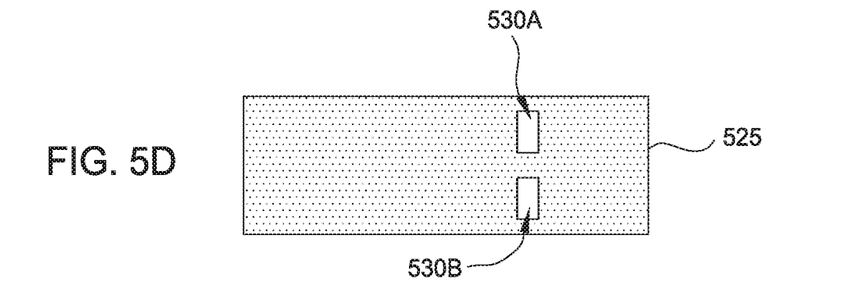

In FIG. 5D, a second mask 525 is disposed over the substrate which include two apertures that are aligned with the substrate. Specifically, the boundaries of the apertures define respective areas 530A and 530B which are sub-regions of area 510B. A second optical filter is disposed onto the areas 530A and 530B. The second optical filter may be different from the first optical filter in that the wavelength or range of wavelengths permitted to pass through the second optical filter is different from the first. In one embodiment, if the optical filters permit a range of wavelengths to pass (e.g., multiple colors), the ranges may either be overlapping (e.g., include the same wavelengths) or non-overlapping (i.e., do not include the same wavelengths).

Figure 5E:
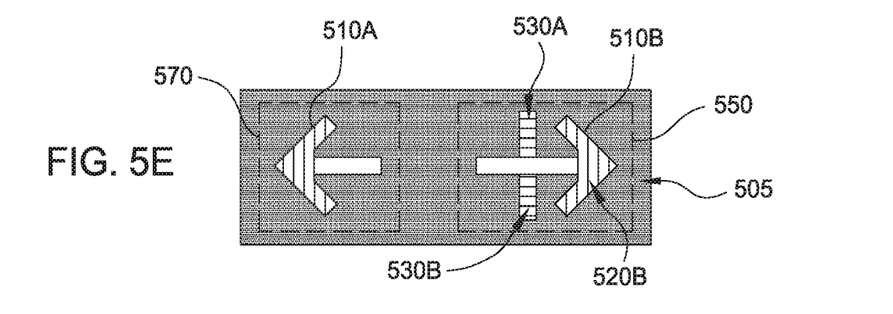

FIG. 5E illustrates the result when the second mask 525 is removed. As shown here, area 510B includes at least two different sub-regions that include different optical filters. Specifically, area 510B includes area 520B that includes the first optical filter and areas 530A and 530B which both include the second optical filter.

Notably, FIGS. 5A-5E illustrate that areas 510, 520, and 530, which are used to form the different images in graphical expressions 540 and 550, may be contiguous rather than the embodiments shown in FIGS. 3A-3I where the areas 310A-E are separated by a portion of the opaque material 305. Both techniques have their advantages. For example, the method in FIGS. 3A-3G may require less sophisticated processing techniques than FIGS. 5A-5E which may reduce costs. However, the process shown in FIGS. 5A-5E may present clearer or more aesthetically pleasing images to the user than graphical expressions fabricated using FIGS. 3A-3I.

Moreover, the method shown in FIGS. 5A-5E may be altered in a same manner as the method shown in FIGS. 3A-3I to form the graphical expression in a frame that supports a display screen rather than forming the graphical expression on the display screen itself.

Figure 6A:
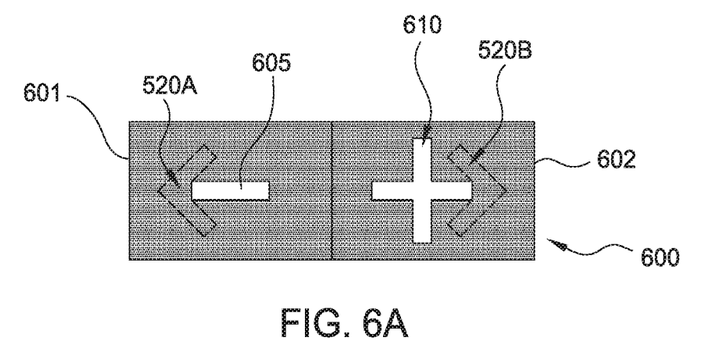
FIG. 6A-6B illustrate presenting different modes of synchronized transforming graphical expressions, according to embodiments described herein.
Figure 6B:
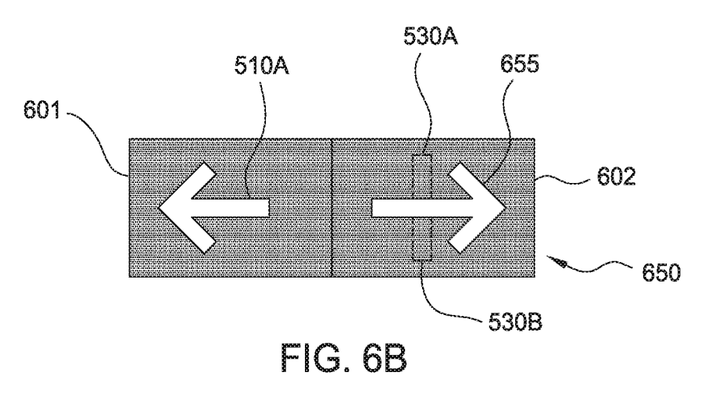

FIG. 6A-6B illustrate presenting different modes of synchronized transforming graphical expressions, according to embodiments described herein. Specifically, FIG. 6A illustrates a first mode 600 of synchronizing graphical expressions for two different buttons 601, 602. That is, instead of operating each button 601, 602 independently, the display screen may set the functions of two or more buttons such that they perform different, albeit related functions. For example, in FIG. 6A, the graphical expression of the leftmost button 601 displays a first image of a minus sign while the graphical expression of the rightmost button 602 displays a second image of a plus sign. To do so, the light source of the leftmost button 601 emits light with any wavelength that is absorbed by the first optical filter disposed in area 520A which is not illuminated (as indicated by the dashed lines). Because the graphical expression also includes area 605 which is not covered with any optical filter, the selected light passes through area 605 and is illuminated (as indicated by the solid lines). Similarly, the light source for the rightmost button 602 may emit the same light as the light source for the leftmost button. Because the same optical filter is disposed in both areas 520A and 520B, area 520B in the rightmost graphical expression also is not illuminated while the uncovered area 610 permits the light to pass through.

Moreover, because the area 610 includes the second optical filter in areas 530A and 530B (not shown), the light selected to perform the first synchronized 600 is passed by the second optical filter in order to illuminate area 610. For example, if the second optical filter permits only red light to pass, then the light source for button 602 may emit red light in order to illuminate all of area 610.

Furthermore, the two buttons 601, 602 may share the same light source (if they both transmit the same color) although doing so may provide lesser illumination than using two separate lights sources. Moreover, while the respective light sources for the two buttons 601, 602 may emit the same light, it is equal possible for the light sources to emit different colored light so long as the colors are blocked by the first optical filter in areas 520A and 520B and passed by the second optical filter in areas 530A and 530B.

FIG. 6B illustrates a second synchronized mode 650 where the graphical expression of the leftmost button 601 displays a third image of a left arrow while the graphical expression of the 602 rightmost button displays a fourth image of a right arrow. That is, the respective graphical expressions of the buttons 601, 602 have transformed to different images to indicate different functions of the buttons 601, 602. To do so, the light source of the leftmost button 601 emits light with any wavelength that is passed by area 520A (which includes the first optical filter). Similarly, the light source for the rightmost button 602 may emit the same light as the light source for the leftmost button 601. As such, area 655 (which includes area 520B) is illuminated. However, the light is blocked by the second optical filter in areas 530A and 530B. That is, the light used by the light source in both 602 is passed by the first optical filter but blocked by the second optical filter.

The two synchronized modes 600 and 650 illuminate related images to indicate the respective functions of the buttons 601 and 602. For example, in mode 600, button 601 may decrease a value while button 602 increases the same value when activated. In mode 650, button 601 may move a cursor to the left while button 602 moves the same cursor to the right. Thus, even though the functions of the buttons 601 and 602 are different, they are related—i.e., they perform opposite functions on the same value or selection element.

Figure 7A:
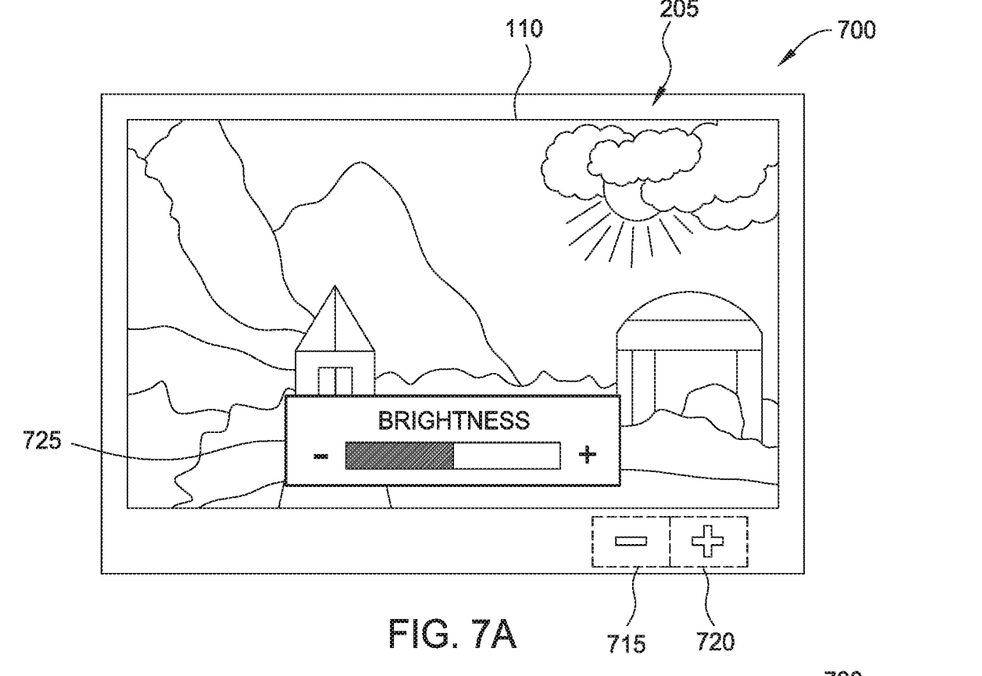
FIGS. 7A-7B illustrate changing the graphical expressions of buttons, according to embodiments described herein.
Figure 7B:
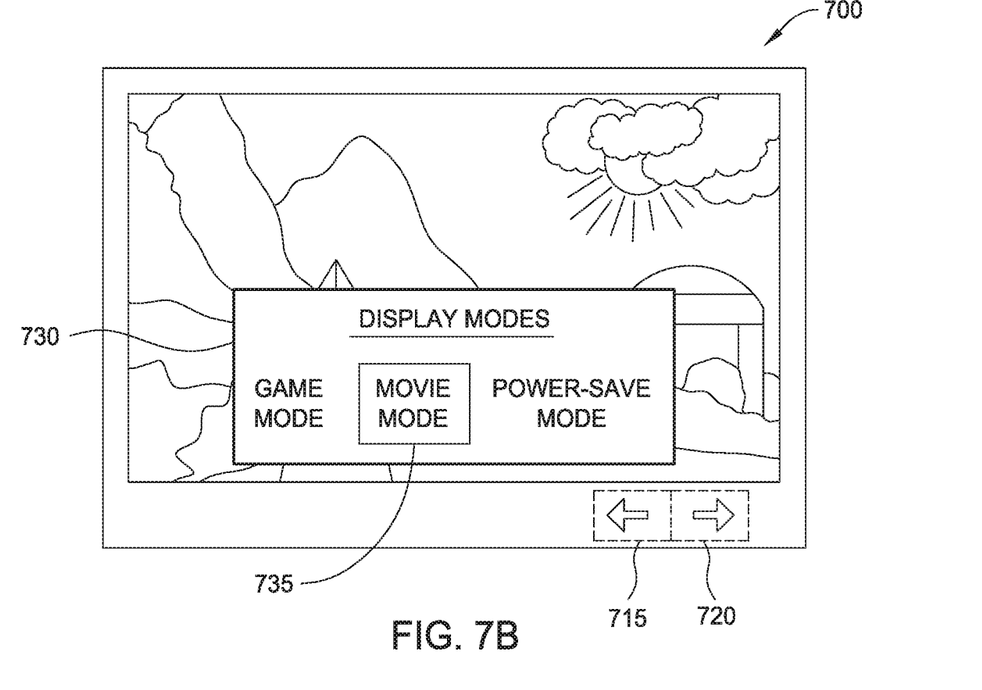

FIGS. 7A-7B illustrate changing the transforming graphical expressions of button, according to embodiments described herein. FIGS. 7A-7B illustrate a display 700 that includes the bezel 205 and a screen 710. In one embodiment, the bezel 205 may be disposed on the display screen 710. As such, the graphical expressions 715 and 720 may be formed on the screen 710—e.g., the screen 710 is the transmissive substrate discussed above. The graphical expressions 715 and 720 are both associated with respective buttons of the display 700. In one example, the user may press the graphical expressions 715 and 720 to active the buttons but this is not a requirement. In another example, the buttons may include a separate actuator proximate to the graphical expressions 715, 720 on the bezel 205 which the user presses to activate the button. Moreover, the button may be use any technique for receiving input from the user—e.g., capacitive sensing, pressure switching, resistance sensing, and the like.

In another embodiment, the bezel 205 may include a frame that supports the screen 710. Instead of the graphical expressions 715 and 720 being fabricated on the screen 710, the graphical expressions 715 and 720 are formed on the frame. To back light the graphical expression 715, the light source may be mounted on the frame or attached to the screen 710.

As shown in FIG. 7A, the illuminated images presented by the transforming graphical expressions 715 and 720 are plus and minus signs. However, these are just non-limiting example of possible images. Other graphical examples include up and down arrows, power button symbol, brightness indicators, and the like. Furthermore, the images may be words such as "MENU", "ON", or "OFF".

The current image presented by the graphical expressions 715 and 720 indicate a current function of the buttons. For example, a graphical interface 725, which indicates a current value of a user-configurable parameter, may be superimposed onto the screen 710. Using the buttons, the user can change the value of this parameter. Advantageously, the images illuminated in the expressions 715 and 720 provide indications to the user of the corresponding button's function. Moreover, the display may correlate the images in the graphical expressions 715 and 720 to the same images in the graphical interface 725. In this example, the interface 725 includes a plus and minus sign for adjusting the brightness of the screen 710. Because the images in the graphical expressions 715 and 720 are the same, the user can quickly identify which button to press to yield the desired result.

FIG. 7B illustrates that the graphical expressions 715 and 720 have transformed to illuminate different images. Now, instead of plus and minus signs, the images are right and left arrows. This indicates to the user that the functions of the buttons have changed. For example, a different graphical interface 730 is presented to the user that includes a plurality of different menus. Using the button, the user changes the currently selected mode 735. For example, if the user presses the graphical expression 720 illuminating the right arrow, the power-save mode is selected, but if the graphical expression 715 illuminating the left arrow is pressed, the game mode is selected.

The graphical interfaces 725, 730 are only two non-limiting examples of functions that may be performed by the buttons on the display 700. Moreover, the embodiments herein may also extend to electronic systems that do not include display screens. For example, the graphical expression may be used in an audio player that lacks any type of display screen. For instance, when music is not playing, the graphical expression may present an image of a play button. However, if music is playing, the graphical expression may transform into an image of a stop button.

The descriptions of the various embodiments of the present invention are presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention were described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. An electronic device, comprising:
   a button configured to perform first and second functions that are different, the button comprises a pattern formed by portions of an optically transmissive substrate exposed by openings in an opaque material disposed over the optically transmissive substrate, the pattern comprising a first portion corresponding to a first one or more of the openings in the opaque material and a second portion corresponding to a second one or more of the openings in the opaque material, the first portion and the second portion are non-overlapping on the optically transmissive substrate, the first portion including an optical filter material different than the opaque material; and
   at least one visible light source configured to selectively emit light of a first color and light of a second color, wherein, when emitting light of the first color, the first portion is illuminated and generates, at least in part, a first visual indication of the first function, and when emitting light of the second color, the second portion is illuminated and the optical filter material blocks the light of the second color, thereby preventing the first portion from being illuminated, and when emitting light of the second color the second portion generates a second visual indication of the second function.

2. The electronic device of claim 1, further comprising a controller configured to control the at least one visible light source such that the at least one visible light source emits light of the first color upon determining the button is configured to perform the first function and emits light of the second color upon determining the button is configured to perform the second function.

3. The electronic device of claim 1, wherein, when emitting light of the first color, both the first portion and the second portion are illuminated.

4. The electronic device of claim 1, wherein the at least one visible light source is disposed on a first side of the optically transmissive substrate that is opposite of a second side of the optically transmissive substrate on which the pattern is formed.

5. The electronic device of claim 4, wherein the second portion permits all light emitted by the at least one visible light source that passes through the optically transmissive substrate to pass there thru substantially unaffected.

6. The electronic device of claim 4, wherein the second portion includes an optical filter different from the optical filter in the first portion, wherein the optical filter in the second portion blocks light of the first color.

7. The electronic device of claim 1, further comprising a display screen, wherein the button is disposed on a bezel of the display screen.

8. A method comprising:
forming a pattern in an opaque material, the pattern dividing an area on an optically transmissive substrate into at least a first portion and a second portion that are disposed in a common layer, the first portion corresponds to a first one or more openings in the opaque material and the second portion corresponds to a second one or more openings in the opaque material;
disposing an optical filter material on the optically transmissive substrate in the first portion of the pattern, wherein the optical filter material blocks visible light of a first predetermined wavelength from passing there thru and the optical filter material is different than the opaque material; and
forming a button configured to perform first and second functions that are different, the button comprising at least one light source arranged to emit light at the first predetermined wavelength and a second predetermined wavelength into the optically transmissive substrate, wherein, when emitting the first predetermined wavelength, the second portion is illuminated and generates a first visual indicator of the first function, and wherein, when emitting the second predetermined wavelength, the first portion is illuminated and generates, at least in part, a second visual indicator of the second function.

9. The method of claim 8, further comprising disposing a different optical filter material on the optically transmissive substrate in the second portion, wherein the second predetermined wavelength is blocked by the different optical material disposed in the second portion, wherein the optical filter material in the first portion permits the second predetermined wavelength to pass through.

10. The method of claim 8, further comprising:
before forming the pattern, disposing the opaque material in liquid state onto the optically transmissive substrate.

11. The method of claim 8, wherein the opaque material is part of a frame that includes the button.

12. The method of claim 8, wherein a shape of the first portion forms at least part of the second visual indicator that represents the second function performed by activating the button.

13. The method of claim 12, wherein a shape of the second portion forms the first visual indicator that represents the second function performed by activating the button, wherein the first visual indicator does not include the first portion.

14. The method of claim 8, further comprising, before disposing the optical filter material, disposing a mask over the pattern and the opaque material, the mask comprising an aperture aligned with the first portion, wherein the second portion is covered by the mask.

15. A user-activated button for an electronic device, comprising:
an optically transmissive substrate configured to receive, and pass there thru, light of a first wavelength and light of a second wavelength; and
a transforming graphical expression disposed on the optically transmissive substrate and comprising a first portion and a second portion that are co-planar, wherein the first portion of the graphical expression includes an optical filtering material that blocks the light of the first wavelength but not light of the second wavelength, wherein the first portion corresponds to a first one or more openings on the optically transmissive substrate and the second portion corresponds to a second one or more openings on the optically transmissive substrate,
wherein, when a light source emits light of the first wavelength, a first image is illuminated in the graphical expression indicating a first visual indication of the button, the first image is defined by a shape of the second portion of the graphical expression,
wherein, when the light source emits light of the second wavelength, a second image is illuminated in the graphical expression indicating a second visual indication of the button, the second image is defined, at least in part, by a shape of the first portion.

16. The button of claim 15, wherein the second image is defined by both the first portion and the second portion.

17. The button of claim 15, wherein the second portion does not include any optical filtering material.

18. The button of claim 15 wherein the second portion includes a different optical filtering material that blocks light of the second wavelength but not light of the first wavelength.

19. The button of claim 15, wherein the light source is disposed on a first side of the optically transmissive substrate that is opposite of a second side of the optically transmissive substrate on which the graphical expression is formed.

20. The button of claim 15, further comprising a display screen, wherein the button is disposed on a bezel of the display screen.

* * * * *

UNITED STATES PATENT AND TRADEMARK OFFICE
CERTIFICATE OF CORRECTION

| | |
|---|---|
| PATENT NO. | : 10,690,320 B2 |
| APPLICATION NO. | : 15/452234 |
| DATED | : June 23, 2020 |
| INVENTOR(S) | : David John Steiner et al. |

It is certified that error appears in the above-identified patent and that said Letters Patent is hereby corrected as shown below:

In the Specification

In Column 5, Line 26, delete "may used" and insert -- may be used --.

In Column 8, Line 29, delete "than" and insert -- then --.

In Column 10, Line 21, delete "FIG." and insert -- FIGS. --.

Signed and Sealed this
Thirty-first Day of January, 2023

Katherine Kelly Vidal
*Director of the United States Patent and Trademark Office*